United States Patent
Li et al.

(10) Patent No.: US 11,293,457 B2
(45) Date of Patent: Apr. 5, 2022

(54) MAGNETIC FAN BLADE CONTROLS

(71) Applicant: HEWLETT-PACKARD DEVELOPMENT COMPANY, L.P., Spring, TX (US)

(72) Inventors: Ai-Tsung Li, Taipei (TW); Chao-Wen Cheng, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 16 days.

(21) Appl. No.: 16/755,803

(22) PCT Filed: Jan. 19, 2018

(86) PCT No.: PCT/US2018/014322
§ 371 (c)(1),
(2) Date: Apr. 13, 2020

(87) PCT Pub. No.: WO2019/143342
PCT Pub. Date: Jul. 25, 2019

(65) Prior Publication Data
US 2020/0340496 A1  Oct. 29, 2020

(51) Int. Cl.
*F04D 29/66* (2006.01)
*G01H 1/00* (2006.01)
(Continued)

(52) U.S. Cl.
CPC ........... *F04D 29/662* (2013.01); *G01H 1/003* (2013.01); *G06F 1/20* (2013.01); *H05K 7/20136* (2013.01)

(58) Field of Classification Search
CPC ......... F04D 29/662; G01H 1/003; G06F 1/20; G06F 1/203; H05K 7/20136
See application file for complete search history.

(56) References Cited

U.S. PATENT DOCUMENTS 6,194,798 B1 * 2/2001 Lopatinsky ........... F04D 25/066
310/63
6,896,476 B2  5/2005 Hung
(Continued)

FOREIGN PATENT DOCUMENTS

DE    3217085 A1   11/1983
EP    2267314 A2   12/2010
TW    201215775 B   4/2012

OTHER PUBLICATIONS

EC-Fans and Motors with Highest Efficiency, Jan. 2016, ECblue.

*Primary Examiner* — Manuel A Rivera Vargas
*Assistant Examiner* — Yaritza H Perez Bermudez
(74) *Attorney, Agent, or Firm* — Tong, Rea, Bentley & Kim LLC

(57) ABSTRACT

In example implementations, an apparatus is provided. The apparatus includes an accelerometer, a plurality of fan blades, a coil magnet and a processor. The accelerometer is coupled to a motor to measure an amount of vibration. The plurality of fan blades is coupled to the motor. Each one of the plurality of fan blades comprises a magnet. The coil magnet is coupled to a fan housing that encloses the motor, the plurality of fan blades and the accelerometer. The processor is communicatively coupled to the motor, the accelerometer, and the coil magnet. The processor activates the coil magnet to control a balance of the plurality of fan blades in response to an amount of vibration measured by the accelerometer that exceeds a threshold.

14 Claims, 3 Drawing Sheets

(51) Int. Cl.
*G06F 1/20* (2006.01)
*H05K 7/20* (2006.01)

(56) References Cited

U.S. PATENT DOCUMENTS

| | | | |
|---|---|---|---|
| 6,896,492 | B2 | 5/2005 | Masterton |
| 7,922,446 | B2 | 4/2011 | Bei et al. |
| 9,546,664 | B2 | 1/2017 | Hsu et al. |
| 9,551,348 | B2 * | 1/2017 | Lin ................. F04D 17/16 |
| 2012/0224951 | A1 | 9/2012 | Degner et al. |
| 2014/0098481 | A1 * | 4/2014 | Hartman ............ F04D 25/0613 |
| | | | 361/679.31 |
| 2014/0119960 | A1 | 5/2014 | Aiello |
| 2014/0244051 | A1 * | 8/2014 | Rollins ................ F04D 27/004 |
| | | | 700/282 |
| 2016/0319845 | A1 | 11/2016 | Molnar |
| 2017/0067470 | A1 * | 3/2017 | Patton .................... G06F 1/203 |
| 2018/0141092 | A1 * | 5/2018 | Davies ................ F04D 29/703 |
| 2020/0329583 | A1 * | 10/2020 | Varadarajan .......... F04D 25/066 |

* cited by examiner

MAGNETIC FAN BLADE CONTROLS

BACKGROUND

Electronic devices can heat up rapidly when operating. Different methods may be employed to help reduce heat in electronic devices. Some solutions may include heat sink designs, ventilation, and/or fans. Fans can be used to help cool electronic devices.

The fan can be electronically controlled and directed towards specific components or areas of the electronic device to help cool the electronic device. For example, in computers the fan may be mounted near a power supply and mother board to help reduce temperatures inside of the computer.

DETAILED DESCRIPTION

Examples described herein provide a method and apparatus for controlling a balance of a fan using magnets. As discussed above, electronic devices can use fans to help reduce the temperature of the electronic devices. However, the gap between the fan and the fan housing may be reduced to maintain a smaller form factor as dimensions of the electronic devices get smaller and thinner. Having a smaller gap between the fan and the fan housing may lead to more noticeable reductions in performance, increase in acoustic noise, and increase risks of fan blade damage due to mechanical interference from the fan housing if the fan is out of balance.

Some solutions to help keep the fan balanced may include a thicker fan. However, a thicker fan may impact the form factor. As noted above, the form factor for electronic devices is getting smaller and thinner. As such, a thicker fan may not be a desirable solution. Other solutions may be cost prohibitive, such as using the hard disk drive bearing on the fan. Still other solutions can cost more manpower resources, such as using a second fine tune balance by a manual clay adding process.

Examples herein provide a design that uses a coil magnet and magnets on the fan blades. The coil magnet may be controlled by a controller or processor of the fan to control an amount of movement of the fan blade to maintain a balance of the fan blade rotation. As a result, the present disclosure provides a relatively inexpensive solution to controlling a balance of a fan in a small form factor.

Figure 1:
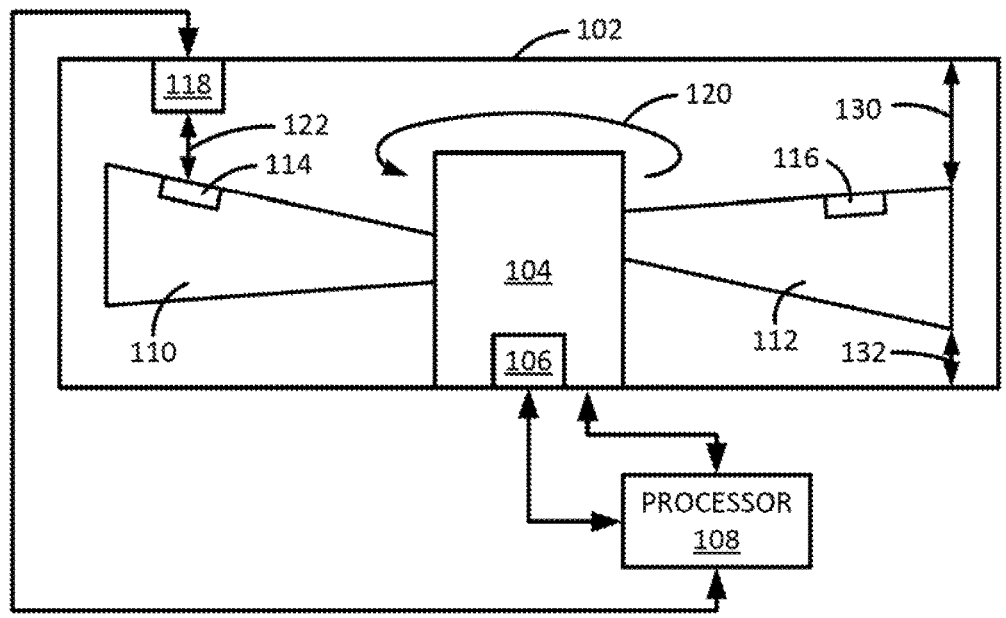
FIG. 1 is a block diagram of a cross-sectional view of an example of an apparatus having a coil magnet to balance fan blades of the present disclosure.

FIG. 1 illustrates a cross-sectional view of an apparatus 100 having a coil magnet to balance fan blades of the present disclosure. In one example, the apparatus 100 may be deployed in a computing device such as a desktop computer, a laptop computer, and the like. For example, the apparatus 100 may be installed inside of a housing of the computing device to cool a processor or other electronic devices within the housing of the computing device.

In one example, the apparatus 100 may include a motor 104, a first fan blade 110, and a second fan blade 112. The first fan blade 110 and the second fan blade 112 may be coupled to the motor 104 and rotated by the motor 104 as shown by an arrow 120. The first fan blade 110 and the second fan blade 112 may have any general shape appropriate for a fan. The first fan blade 110 and the second fan blade 112 may have the same shape and dimensions. Although two fan blades 110 and 112 are illustrated in FIG. 1, it should be noted that any number of fan blades may be deployed.

In one example, the motor 104, the first fan blade 110, and the second fan blade 112 may be enclosed within a fan housing 102. The fan housing 102 may be dimensioned to minimize a gap 130 and a gap 132 between an inside surface of the fan housing 102 and a widest portion of the first fan blade 110 and the second fan blade 112.

As noted above, sometimes the first fan blade 110 and the second fan blade 112 may become unbalanced and rotate off plane. For example, the rotational plane may be an imaginary plane that is parallel to the rotational direction as shown by the arrow 120, or parallel to a top surface and a bottom surface of the fan housing 102. In other words, when the first fan blade 110 tilts slightly lower or higher than the second fan blade 112, the rotational plane may become tilted. This may cause the first fan blade 110 or the second fan blade 112 to contact the inside surface of the fan housing 102.

In one example, the present disclosure includes at least one coil magnet 118 coupled to the fan housing 102. The coil magnet 118 may be a single coil magnet or a set of coil magnets 118. The first fan blade 110 may have a first magnet 114, and the second fan blade 112 may have a second magnet 116. The first magnet 114 and the second magnet 116 may be located on the respective fan blades 110 and 112 to be aligned under the coil magnet 118 when the respective fan blades 110 and 112 are rotating around inside of the fan housing 102. In other words, the coil magnet 118 may be aligned with a rotational path of the first magnet 114 and the second magnet 116 on the first fan blade 110 and the second fan blade 212, respectively. For example, FIG. 1 shows how the first magnet 114 is located directly below the coil magnet 118 when the first fan blade 110 is rotated into a position illustrated in FIG. 1.

In addition, an accelerometer 106 may be coupled to the motor 104. The coil magnet 118, the accelerometer 106, and the motor 104 may be communicatively coupled to a processor 108. The processor 108 may control operation of the motor 104. For example, the processor 108 may control when the motor 104 turns on and off and how quickly the motor 104 rotates.

In one example, the accelerometer 106 may monitor vibration levels of the motor 104. The accelerometer 106 may measure an amount of vibration of the motor 104 and provide the data to the processor 108. When the amount of vibration exceeds a threshold, the processor 108 may activate the coil magnet 118. For example, the processor 108 may cause current from a power source to be applied to the coil magnet 118.

The amount and direction of the current that is applied to the coil magnet 118 may determine a force of a magnetic field that is created by the coil magnet 118. For example, the amount of force of the magnetic field that is created may determine how much distance the first fan blade 110 or the second fan blade 112 is moved in a direction shown by an arrow 122. In one example, the direction of the arrow 122 is perpendicular to a rotational plane of the first fan blade 110 and the second fan blade 112 described above.

For example, when a current is applied in a first direction, the coil magnet 118 may create a magnetic field that attracts the first magnet 114 towards the coil magnet 118. When a current is applied in a second direction that is opposite the first direction, the coil magnet 118 may create a magnetic field that repels the first magnet 114 away from the coil magnet 118. The second magnet 116 may be moved similarly when the second fan blade 112 is moved under the coil magnet 118.

In one example, the threshold may be an amount of vibration that is associated with an amount of movement of the first fan blade 110 and the second fan blade 112 that causes an imbalance. For example, the threshold may be predefined based on empirical data that is collected related to how much vibration is correlated to what distance of movement along a direction as shown by the arrow 122. An amount of vibration that causes movement of the first fan blade 110 and the second fan blade 112 to move outside an operational tolerance may be set as the threshold.

As a result, the processor 108 may control operation of the coil magnet 118 to maintain a balance between the first fan blade 110 and the second fan blade 112. By controlling the balance between the first fan blade 110 and the second fan blade 112, the dimensions of the fan housing 102 may be minimized to allow for smaller form factors. Similarly, the smaller form factor of the apparatus 100 may allow the computing devices that install the apparatus 100 to also maintain a smaller form factor. In addition, maintaining the balance between the first fan blade 110 and the second fan blade 112 may help to maximize the operational efficiency of the apparatus 100.

Figure 2:
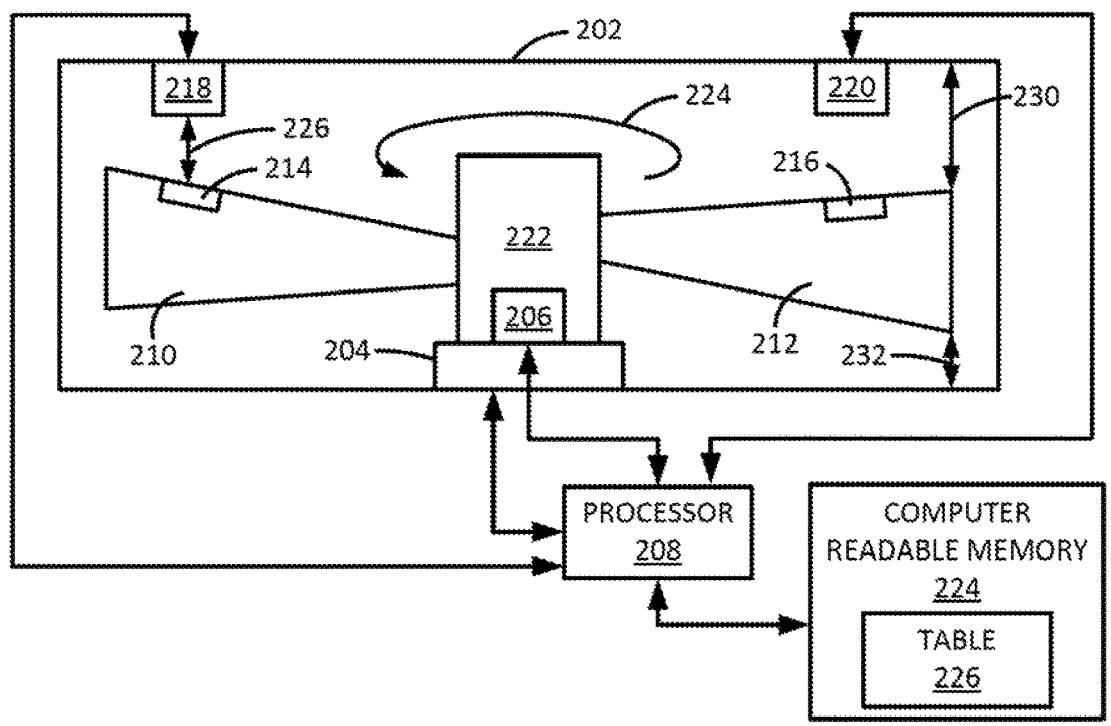
FIG. 2 is another block diagram of a cross-sectional view of an example of an apparatus having a coil magnet to balance fan blades of the present disclosure.

FIG. 2 illustrates a cross-sectional view of an apparatus 200 having a coil magnet to balance fan blades of the present disclosure. In one example, the apparatus 200 may be deployed in a computing device such as a desktop computer, a laptop computer, and the like. For example, the apparatus 200 may be installed inside of a housing of the computing device to cool a processor or other electronic devices within the housing of the computing device.

The apparatus 200 may be similar to the apparatus 100. For example, the apparatus 200 may include a motor 204, a first fan blade 210, and a second fan blade 212. The first fan blade 210 and the second fan blade 212 may be coupled to a fan blade shaft 222. The fan blade shaft 222 may be coupled to the motor 204 and rotated by the motor 204, as shown by an arrow 224. The first fan blade 210 and the second fan blade 212 may have any general shape appropriate for a fan. The first fan blade 210 and the second fan blade 212 may have the same shape and dimensions. Although two fan blades 210 and 212 are illustrated in FIG. 2, it should be noted that any number of fan blades may be deployed.

In one example, the motor 204, the first fan blade 210, and the second fan blade 212 may be enclosed within a fan housing 202. The fan housing 202 may be dimensioned to minimize a gap 230 and a gap 232 between an inside surface of the fan housing 202 and a widest portion of the first fan blade 210 and the second fan blade 212.

In one example, the apparatus 200 may include two coil magnets 218 and 220. The coil magnets 218 and 220 may each be coupled to the fan housing 202. The first fan blade 210 may have a first magnet 214, and the second fan blade 212 may have a second magnet 216. The first magnet 214 and the second magnet 216 may be located on the respective fan blades 210 and 212 that are opposite one another (e.g., 180 degrees part, or along a straight line that runs through both the first fan blade 210 and 212). The first magnet 214 may be located on the first fan blade 210 to be aligned under the coil magnet 118. The second magnet 216 may be located on the second fan blade 212 to be aligned under the coil magnet 220. Thus, the first magnet 214 and the second magnet 216 may be aligned with the first coil magnet 218 and the second coil magnet 220, respectively, when the respective fan blades 210 and 212 are rotating around inside of the fan housing 102. Said another way, the first coil magnet 218 and the second coil magnet 220 may be aligned with a rotational path of the first magnet 214 and the second coil magnet 220 on the first fan blade 210 and the second fan blade 212, respectively.

For example, FIG. 2 shows how the first magnet 214 is located directly below the coil magnet 218 when the first fan blade 210 is rotated into a position illustrated in FIG. 2. Similarly, FIG. 2 shows how the second magnet 216 is located directly below the coil magnet 220 when the second fan blade 212 is rotated into a position illustrated in FIG. 2. As the first fan blade 210 and the second fan blade 212 continue along the rotational path, the magnet 216 of the second fan blade 212 may be located directly below the coil magnet 218. The magnet 214 of the first fan blade 210 may be located directly below the coil magnet 220.

In addition, an accelerometer 206 may be coupled to the fan blade shaft 222 or the motor 204. The coil magnet 218, the coil magnet 220, the accelerometer 206, and the motor 204 may be communicatively coupled to a processor 208. The processor 208 may control operation of the motor 204. For example, the processor 208 may control when the motor 204 turns on and off and how quickly the motor 204 rotates.

In one example, the processor 208 may be communicatively coupled to a computer readable memory 224. The computer readable memory 224 may be a non-transitory computer readable storage medium such as a hard disk drive, a random access memory (RAM), a read only memory (ROM), and the like. In one example, the computer readable memory 224 may store a table 226.

The table 226 may store pre-defined values for an amount of distance that the fan blades 210 and 212 are moved based an amount of vibration measured by the accelerometer 206. In addition, the table 226 may provide values for an amount of current that is delivered to the coil magnets 218 and 220 to move the same fan blades 210 and 212 for a particular amount of vibration. For example, the pre-defined values may be collected from empirical data that is collected when various different currents are applied to the coil magnets 218 and 220. For example, the table 226 that includes a spreadsheet with a first column of different amounts of vibration, a second column of values for a distance of movement for each one of the different amounts of vibration, and a third column of values for an amount of current and direction of the current that is applied for the distance of movement for each one of the different amounts of vibration.

As a result, the table 226 may provide values of current that are delivered to the coil magnets 218 and 220 to move the fan blades 210 and 212 a distance to offset the distance of movement caused by the amount of vibration. For example, as discussed above, applying a current to the coil magnets 218 and 220 may create a magnetic field. The amount and direction of the current that is applied to the coil magnets 218 and 220 may determine a force of a magnetic field that is created by the coil magnets 218 and 220.

In one example, the current may be applied in opposite directions to the coil magnet 218 and the coil magnet 220.

For example, vibration in the fan blade shaft 222 may cause an imbalance between the first fan blade 210 and the second fan blade 212. The imbalance may cause the second fan blade 212 to be higher than the first fan blade 210. In other words, in a position shown in FIG. 2, an imbalance may cause the second fan blade 212 to tilt towards the coil magnet 220 and the first fan blade 210 to tilt away from the coil magnet 218. As a result, a current may be applied to the coil magnet 218 in a first direction to create a magnetic field that attracts the first magnet 214 towards the coil magnet 218.

At the same time, the same current may be applied to the coil magnet 220, but in a second direction that is opposite the first direction of the current applied to the coil magnet 218. The opposite direction of the current in the coil magnet 220 may cause a magnetic field to be created that repels the second magnet 216 away from the coil magnet 220. Thus, the opposite movement of the first magnet 214 and the second magnet 216 may control a balance between the first fan blade 210 and the second fan blade 212.

It should be noted that the current may also be applied to the coil magnet 218 and the coil magnet 220 to cause an opposite movement. For example, the current may be applied to the coil magnet 218 to create a magnetic field that repels the first magnet 214. The same amount of current in an opposite direction may be applied to the coil magnet 220 to create a magnetic field that attracts the second magnet 216.

In one example, the accelerometer 206 may monitor vibration levels of the fan blade shaft 222 or the motor 204. The accelerometer 206 may measure an amount of vibration of the motor 204 and provide the data to the processor 208. The processor 208 may periodically receive measurements from the accelerometer 206. When the amount of vibration exceeds a threshold, the processor 208 may access the table 226 to determine an amount of movement caused by the vibration and an amount of current to offset the amount of movement caused by the vibration. The processor 208 may activate the coil magnets 218 and 220 based on the values that are found in the table 226. A computing device that the apparatus 200 is installed inside of may have a power source that provides the current that is applied to the coil magnets 218 and 220.

Similar to the apparatus 100, in one example, the threshold may be an amount of vibration that is associated with an amount of movement of the first fan blade 210 and the second fan blade 212 that causes an imbalance. For example, the threshold may be predefined based on empirical data that is collected related to how much vibration is correlated to what distance of movement along a direction as shown by the arrow 226. An amount of vibration that causes movement of the first fan blade 210 and the second fan blade 212 to move outside of an operational tolerance may be set as the threshold.

It should be noted that the apparatus 100 illustrated in FIG. 1 and the apparatus 200 illustrated in FIG. 2 have been simplified for ease of explanation. For example, the apparatus 100 and the apparatus 200 may include electrical connections to a power supply to power the motor and the coil magnets, may include vents in the housing, and the like.

Figure 3:
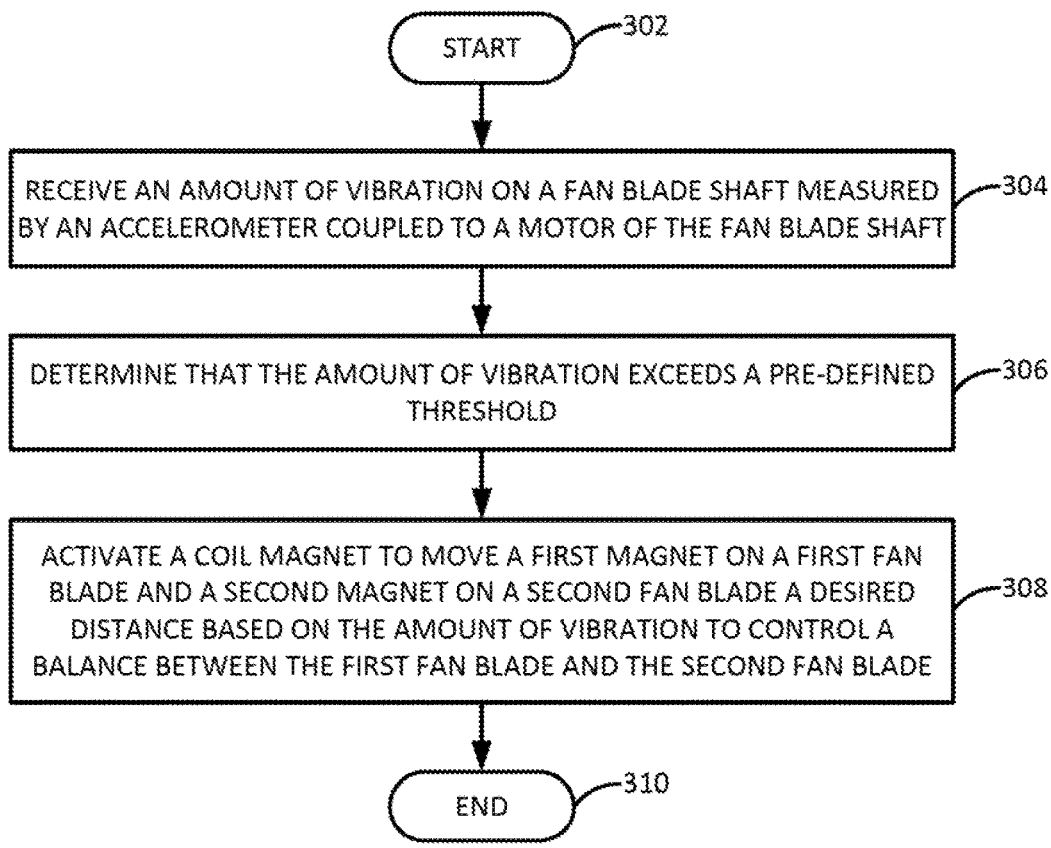
FIG. 3 is a flow chart of an example method for controlling a balance between a first fan blade and a second fan blade via a coil magnet.

FIG. 3 illustrates a flow diagram of an example method 300 for controlling a balance between a first fan blade and a second fan blade via a coil magnet. In one example, the method 300 may be performed by the apparatus 100, 200, or the apparatus 400 illustrated in FIG. 4 and described below.

At block 302, the method 300 begins. At block 304, the method 300 receive an amount of vibration on a fan blade shaft measured by an accelerometer coupled to a motor of the fan blade shaft. For example, over time the fan blades may be come slightly warped due to exposure to heat inside of a computing device, collect dust and debris unevenly, and the like. As a result, the fan blades coupled to the fan blade shaft may become unbalanced (e.g., rotate along a rotational path that is not parallel to a top and bottom surface of a fan housing). The imbalance can cause the fan blade shaft to vibrate.

At block 306, the method 300 determines that the amount of vibration exceeds a pre-defined threshold. In one example, the pre-defined threshold may be an amount of vibration that causes the fan blades to move outside of an operational tolerance. For example, outside of an operational tolerance may include an amount of movement that may cause a fan blade to contact an inside surface of the fan housing, cause a vibrational noise above a desired decibel level, and the like.

At block 308, the method 300 activates a coil magnet to move a first magnet on a first fan blade and a second magnet on a second fan blade a desired distance based on the amount of vibration to control a balance between the first fan blade and the second fan blade.

For example, activating the coil magnet may include causing a current to be applied to the coil magnet in a particular direction. The current may generate a magnetic field to either attract or repel the first magnet on the first fan blade and the second magnet on the second fan blade depending on a direction of the current.

In one example, a pre-defined table that provides information for how much current should be applied for a particular amount of movement caused by a particular amount of vibration may be stored in memory. The pre-defined table may include values for different amounts of measured vibration. Each amount of measured vibration may be associated with a distance or an amount of movement. Each distance or an amount of movement may be associated with an amount of current used to create a magnetic field by the coil magnet with enough force to move a fan blade by the associated distance.

For example, a vibration value of 200 Hertz (Hz) may cause the fan blade to move by 1 millimeter (mm). A current of 50 amperes (amps) may be associated with the distance of 1 mm. In other words, 50 amps of current may be used to create a magnetic field strong enough to repel or attract the magnet with enough force to move a fan blade coupled to the magnet by 1 mm.

In one example, a plurality of coil magnets may be deployed to control the balance of the first fan blade and the second fan blade. For example, two coil magnets may be deployed on opposite sides of one another (e.g., 180 degrees apart). An equal current, but in opposite directions may be applied to the two coil magnets. As a result, one coil magnet may attract the first magnet of the first fan blade and the other coil magnet may repel the second magnet of the second fan blade, or vice versa. At block 310, the method 300 ends.

Figure 4:
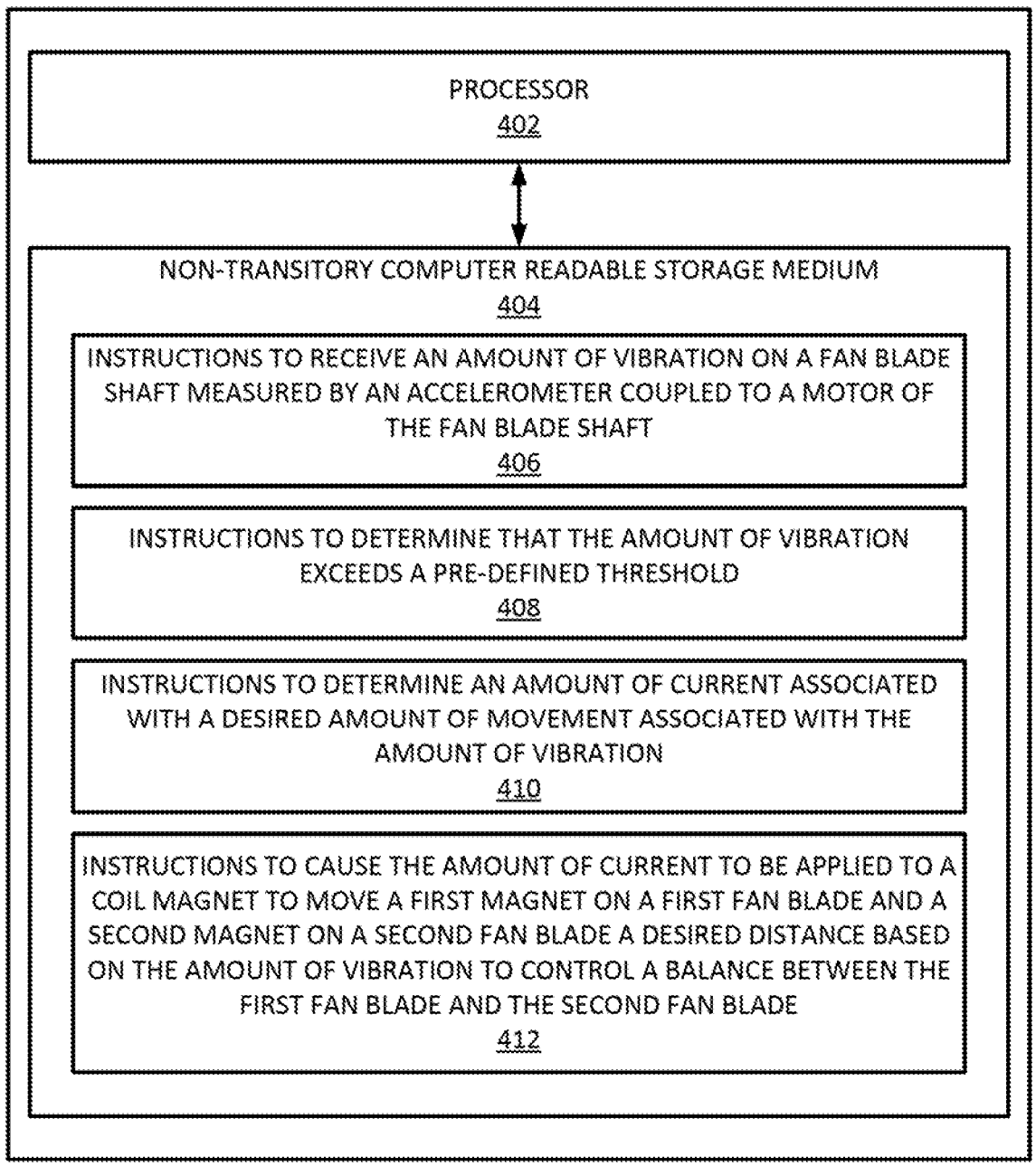
FIG. 4 is a block diagram of an example non-transitory computer readable storage medium storing instructions executed by a processor to control current applied to a coil magnet to balance a first fan blade and a second fan blade.

FIG. 4 illustrates an example of an apparatus 400. In one example, the apparatus 400 may be the apparatus 100 or 200. In one example, the apparatus 400 may include a processor 402 and a non-transitory computer readable storage medium 404. The non-transitory computer readable storage medium 404 may include instructions 406, 408, 410, and 412 that, when executed by the processor 402, cause the processor 402 to perform various functions to control current applied to a coil magnet to balance a first fan blade and a second fan blade.

In one example, the instructions 406 may include instructions to receive an amount of vibration on a fan blade shaft measured by an accelerometer coupled to a motor of the fan blade shaft. The instructions 408 may include instructions to determine that the amount of vibration exceeds a pre-defined threshold. The instructions 410 may include instructions to determine an amount of current associated with a desired amount of movement associated with the amount of vibration. The instructions 412 may include instructions to cause the amount of current to be applied to a coil magnet to move a first magnet on a first fan blade and a second magnet on a second fan blade a desired distance based on the amount of vibration to control a balance between the first fan blade and the second fan blade.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. An apparatus, comprising:
    an accelerometer coupled to a motor to measure an amount of vibration;
    a first fan blade having a first magnet;
    a second fan blade having a second magnet;
    a set of coil magnets coupled to a fan housing that encloses the motor, the first fan blade, the second fan blade, and the accelerometer;
    a processor communicatively coupled to the motor, the accelerometer, and the set of coil magnets, wherein the processor is to activate the set of coil magnets to control a balance the first fan blade and the second fan blade in response to a determination that the amount of vibration exceeds a threshold; and
    a memory to store a pre-defined table comprising an amount of current to deliver to the set of coil magnets to move the first magnet of the first fan blade or the second magnet of the second fan blade a desired distance for a plurality of different amounts of vibration.

2. The apparatus of claim 1, wherein the set of coil magnets is aligned with a rotational path of the first magnet of the first fan blade and the second magnet of the second fan blade.

3. The apparatus of claim 1, wherein a direction of a magnetic field of the set of coil magnets is perpendicular to a rotational plane of the first fan blade and the second fan blade.

4. The apparatus of claim 1, wherein the set of coil magnets comprises a first coil magnet and a second coil magnet, wherein the first coil magnet and the second coil magnet are located on opposite sides of the fan housing.

5. The apparatus of claim 4, wherein a first current delivered to a first coil magnet is in an opposite direction of a second current delivered to a second coil magnet.

6. The apparatus of claim 1, wherein the processor controls the balance of the first fan blade and the second fan blade by causing the amount of current associated with the amount of vibration measured by the accelerometer to be delivered to the set of coil magnets to move the first magnet of the first fan blade or the second magnet of the second fan blade by the desired distance based on the pre-defined table.

7. An apparatus, comprising:
    an accelerometer coupled to blade shaft of a motor to measure an amount of vibration of the blade shaft;
    a first fan blade coupled to the blade shaft, the first fan blade having a first magnet;
    a second fan blade coupled to the blade shaft, the second fan blade having a second magnet;
    a plurality of coil magnets coupled to a fan housing that encloses the motor, the first fan blade, the second fan blade, and the accelerometer;
    a computer readable memory to store a table of movement values; and
    a processor communicatively coupled to the motor, the accelerometer, the plurality of coil magnets, and the computer readable memory, wherein the processor is to activate the plurality of coil magnets to control a balance between the first fan blade and the second fan blade based on the amount of vibration and the movement values associated with the amount of vibration.

8. The apparatus of claim 7, wherein the plurality of coil magnets comprises a first coil magnet and a second coil magnet, wherein the first coil magnet and the second coil magnet are located on opposite sides of the fan housing.

9. The apparatus of claim 8, wherein the first coil magnet and the second coil magnet are activated in opposite directions.

10. The apparatus of claim 9, wherein an amount of current is applied to the first coil magnet in a first direction and the amount of current is applied to the second coil magnet in a second direction that is opposite the first direction.

11. The apparatus of claim 7, wherein the processor is to activate the plurality of coil magnets continuously based on periodic measurements of the amount of vibration that is measured by the accelerometer.

12. The apparatus of claim 7, wherein the table movement values determines an amount of movement caused by the amount of vibration and an amount of current to offset the amount of movement caused by the vibration.

13. A non-transitory computer readable storage medium encoded with instructions executable by a processor, the non-transitory computer-readable storage medium comprising:
    instructions to receive an amount of vibration on a fan blade shaft measured by an accelerometer coupled to a motor of the fan blade shaft;
    instructions to determine that the amount of vibration exceeds a pre-defined threshold;
    instructions to determine an amount of current associated with a desired amount of movement associated with the amount of vibration; and
    instructions to cause the amount of current to be applied to a coil magnet to move a first magnet on a first fan blade and a second magnet on a second fan blade a desired distance based on the amount of vibration to control a balance between the first fan blade and the second fan blade.

14. The non-transitory computer readable storage medium of claim 13, wherein the instructions to cause the amount of current to be applied comprises instructions to apply the amount of current to a second coil magnet that is located opposite to the coil magnet, wherein the amount of current applied in the second coil magnet is in an opposite direction of a direction of the amount of current that is applied to the coil magnet.

\* \* \* \* \*